United States Patent [19]

Bushard et al.

[11] Patent Number: 5,543,727

[45] Date of Patent: Aug. 6, 1996

[54] RUN-IN TEST SYSTEM FOR PC CIRCUIT BOARD

[75] Inventors: Bradley B. Bushard, Chaska; Philip G. Dion, Columbia Heights; Joseph V. Heinz, Eden Prairie, all of Minn.

[73] Assignee: BellSouth Corporation, Atlanta, Ga.

[21] Appl. No.: 222,859

[22] Filed: Apr. 5, 1994

[51] Int. Cl.$^6$ ................................................ G01R 31/02
[52] U.S. Cl. ..................... 324/760; 324/158.1; 364/550
[58] Field of Search ............................ 324/73.1, 198.1, 324/512, 760; 236/15 BB; 364/550, 551.01

[56] References Cited

U.S. PATENT DOCUMENTS

| | | | |
|---|---|---|---|
| 4,711,024 | 12/1987 | Russell | 29/832 |
| 4,714,875 | 12/1987 | Bailey et al. | 324/73 PC |
| 4,918,693 | 4/1990 | Ardini, Jr. et al. | 371/21.6 |
| 5,111,402 | 5/1992 | Brooks et al. | 324/73.1 |
| 5,202,639 | 4/1993 | McKeon et al. | 324/158.1 |
| 5,205,132 | 4/1993 | Fu | 236/15 BB |
| 5,223,788 | 6/1993 | Andreano et al. | 324/73.1 |
| 5,278,495 | 1/1994 | Beaton et al. | 324/158.1 |

*Primary Examiner*—Kenneth A. Wieder
*Assistant Examiner*—Russell M. Kobert
*Attorney, Agent, or Firm*—Faegre & Benson

[57] ABSTRACT

An automated functional test system for PC circuit boards. The test system includes a test chamber for removably receiving circuit boards to be tested, heating and cooling systems for controlling the temperature in the test chamber, a display, a variable circuit board power supply and diagnostics memory for storing PC circuit board diagnostic software. A control system is coupled to the heating and cooling systems, display, power supply and diagnostics memory. The control system causes the circuit board to execute the diagnostic software during low temperature, high temperature and cycling temperature diagnostic phases. The diagnostic phases are sequentially and repeatedly performed during a test cycle. The cooling system is actuated during the low temperature diagnostic phases to cool the test chamber to ambient temperature. The heating system is actuated during the high temperature diagnostic phases to heat the test chamber. Both the heating and cooling systems are actuated during the cycling temperature diagnostic phases to cycle the temperature. The power supplied to the circuit board is varied during the diagnostic phases. If the circuit board fails to properly execute the diagnostic software during the diagnostic phases, the display is actuated to provide an indication of a functional test failure. The display is actuated to provide an indication of a functional test completion at the end of the test cycle if the circuit board successfully executes the diagnostic software during the diagnostic phases.

25 Claims, 12 Drawing Sheets

5,543,727

RUN-IN TEST SYSTEM FOR PC CIRCUIT BOARD

BACKGROUND OF THE INVENTION

1. Field of the Invention

The present invention relates generally to systems for testing circuit boards. In particular, the present invention is a modular and automated system for testing personal computer (PC) circuit boards.

2. Description of the Related Art

Microprocessor-based personal computer (PC) and other circuit boards are complex assemblies of electronic components. Despite the use of high-quality components and assembly procedures, they are for this reason subject to occasional manufacturing defects and failures during use. The costs associated with such defects and failures in terms of manufacturer warranty obligations and end-user down time are relatively high. Before delivery to end-users following their manufacture or subsequent repair, circuit boards of this type are therefore subjected to functional tests to determine whether they are capable of operating properly.

One functional testing method includes the use of specialized diagnostic software. Using this method, a technician will connect the circuit board to be tested to a video monitor and a drive or other memory device loaded with the diagnostic software, and initiate the execution of the software by the circuit board. The diagnostic software is designed to test the operation and interconnections of the circuit board components, and provides graphic displays on the monitor indicating the nature of any identified faults. Diagnostic software of this type is commercially available from most circuit board manufacturers (i.e., original equipment manufacturer (OEM) diagnostic software). Aftermarket diagnostic software is also commercially available from independent software vendors. Unfortunately, these diagnostic software test procedures are relatively inefficient and time consuming for the technician to perform. These test procedures are also somewhat inaccurate since they generally do not simulate the full range of operating environments to which the circuit boards are exposed during operation by the end-users. Latent and intermittent faults can be especially difficult to detect using these test procedures.

It is evident that there is a continuing need for improved circuit board test systems. A system capable of functionally testing circuit boards in a variety of environmental conditions would be especially desirable. To be commercially viable, any such system must be accurate, relatively inexpensive and efficient to operate.

SUMMARY OF THE INVENTION

The present invention is a relatively inexpensive test system capable of automatically and extensively testing microprocessor-based and other circuit boards under a wide range of operating environments to provide a high confidence indication of functionality. One embodiment of the test system includes a test chamber for removably receiving circuit boards to be tested, a heating system, a cooling system, a display, diagnostics memory for storing circuit board diagnostic software, and a control system. The control system is configured for interconnection to the circuit boards and is coupled to the heating system, cooling system, display and diagnostics memory. The control system actuates the cooling system and causes the circuit board to execute the software diagnostics while the circuit board is cooled to a first temperature during a relatively low temperature diagnostics phase. The control system actuates the heating system and causes the circuit board to execute the software diagnostics while the circuit board is heated to a second temperature greater than the first temperature during a relatively high temperature diagnostics phase. The execution of the diagnostic software during the diagnostic phases is monitored by the control system. The control system actuates the display to provide an indication of a functional test failure if the circuit board fails to complete the execution of the diagnostic software during the diagnostic phases.

In another embodiment the control system actuates the cooling and heating systems and causes the circuit board to execute the diagnostic software while the circuit board is cooled and heated during a cycling temperature diagnostic phase. The low temperature, high temperature and cycling temperature diagnostic phases are sequentially and repeatedly performed by the control system. The control system is also coupled to a variable power supply, and causes the power supplied to the circuit board to vary during the diagnostic phases.

In yet another embodiment, the test system includes a watchdog timer for timing watchdog periods during the execution of the diagnostic phases and a test cycle timer for timing a test cycle. The control system causes the display to provide the indication of a functional test failure if the circuit board fails to complete the diagnostic phases during the watchdog periods. The control system also causes the display to provide an indication of a functional test completion at the end of the test cycle if the diagnostic software is successfully executed during the test cycle.

DETAILED DESCRIPTION OF THE PREFERRED EMBODIMENTS

Figure 1:
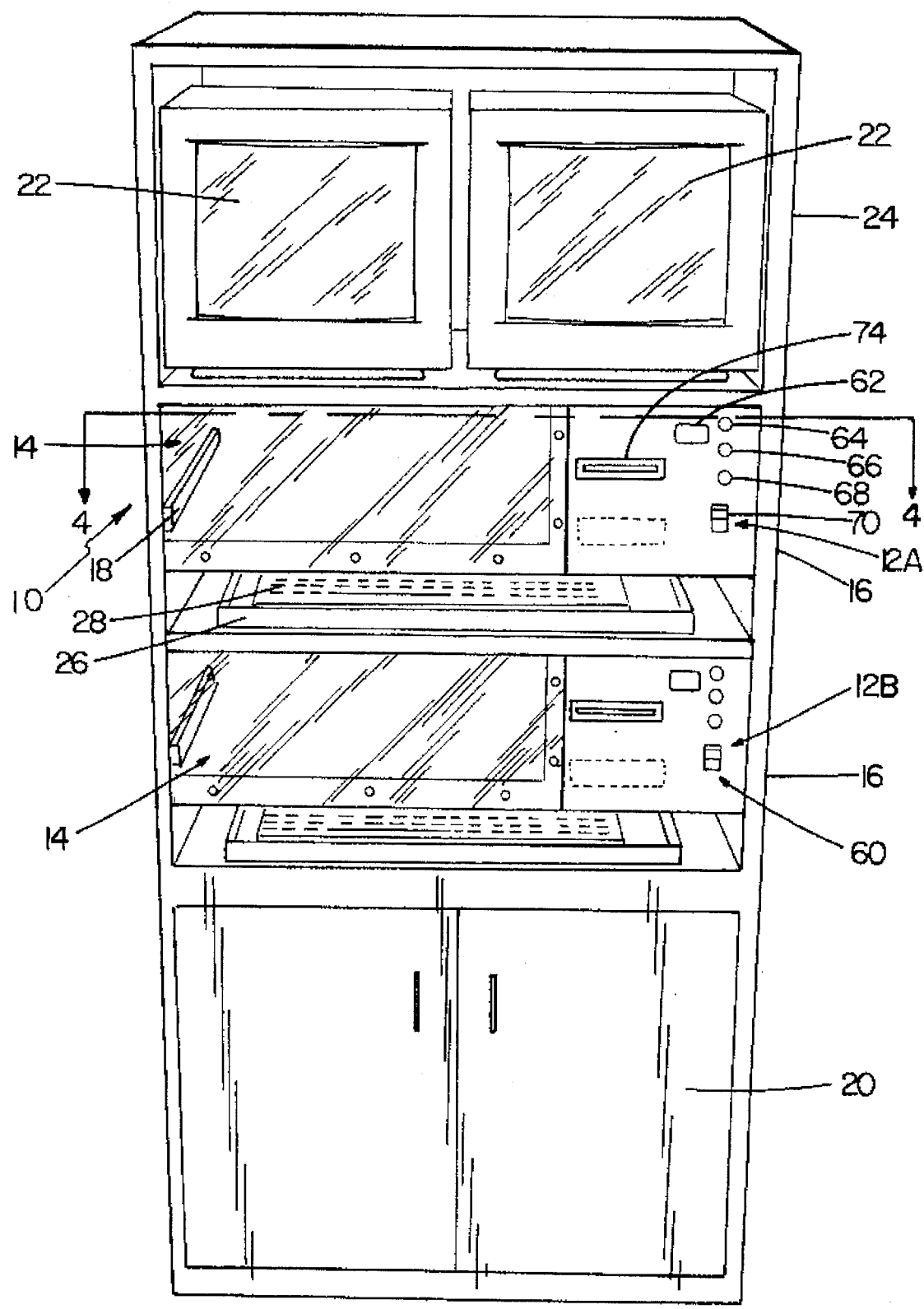
FIG. 1 is a perspective view of a rack including two circuit board test systems in accordance with the present invention.
Figure 2:
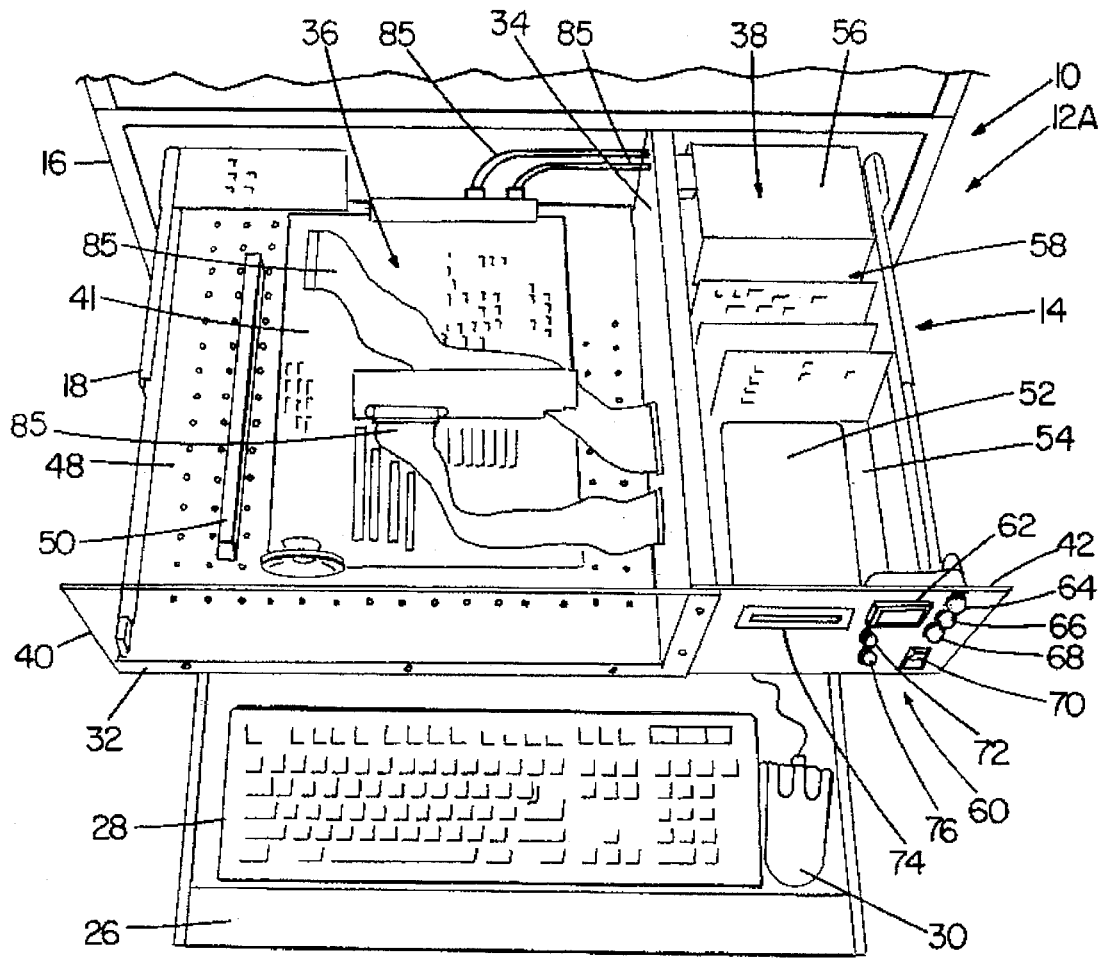
FIG. 2 is a detailed view of the rack shown in FIG. 1, with one of the drawers open to show one of the test systems and a circuit board unit under test.
Figure 5:
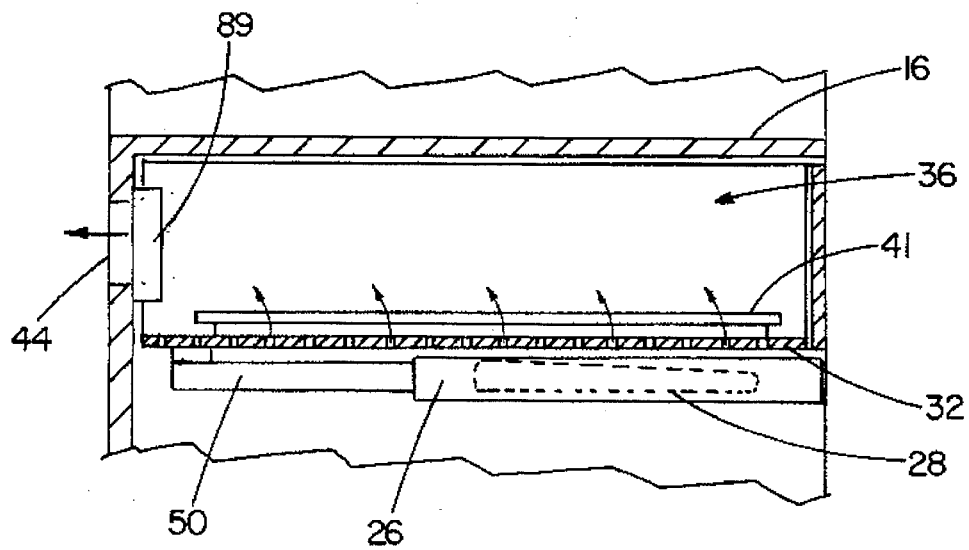
FIG. 5 is a sectional view of the rack taken along lines 5—5 in FIG. 4, illustrating the air flow induced through the test chamber by the fans.
Figure 3:
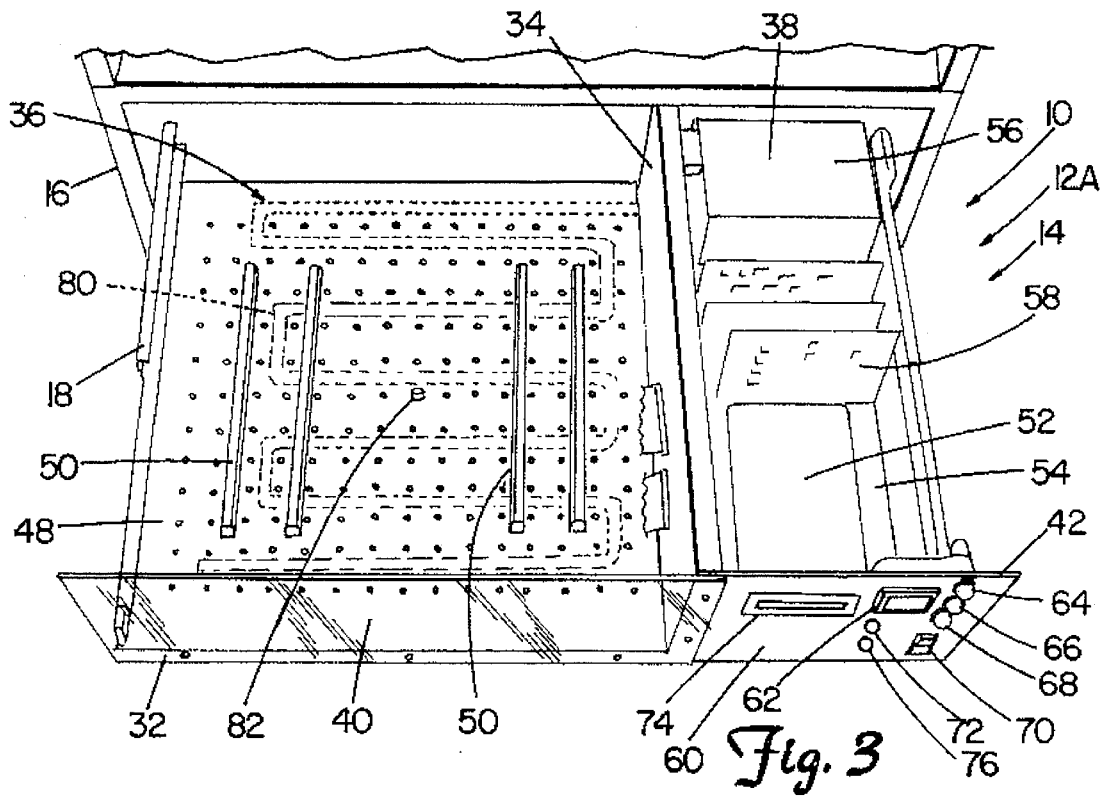
FIG. 3 is a view of the drawer and test system shown in FIG. 2, without the circuit board unit under test.
Figure 4:
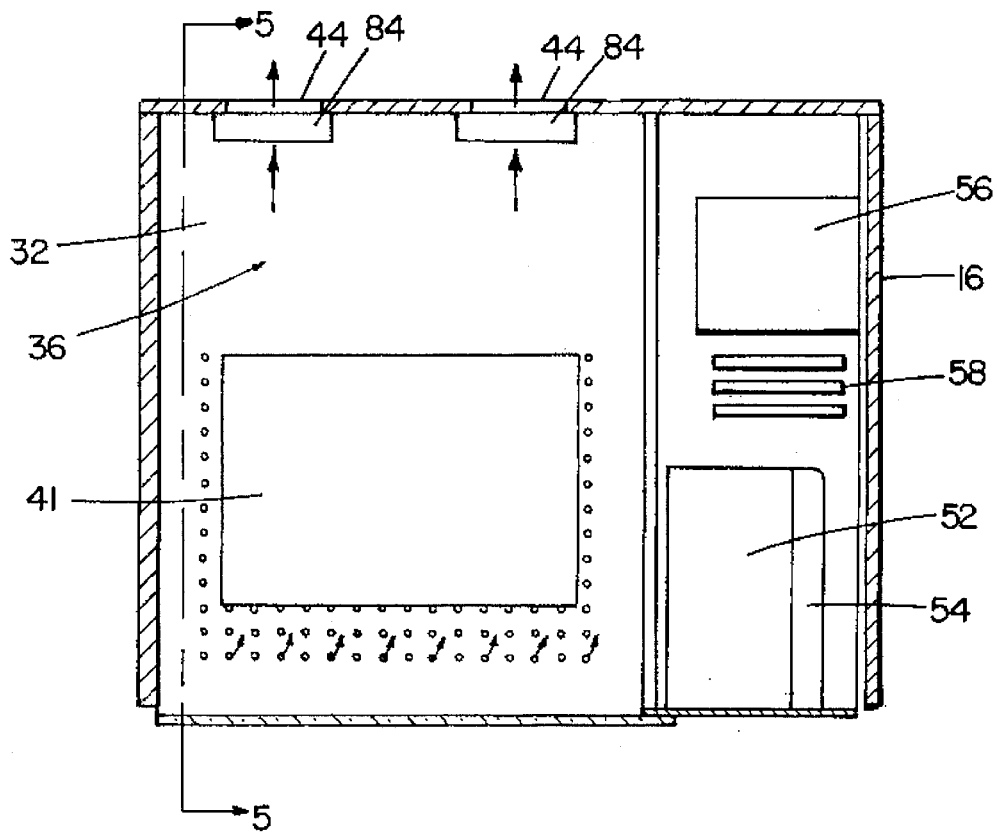
FIG. 4 is a sectional view of the rack taken along lines 4—4 in FIG. 1, illustrating the fans for inducing an air flow through the test chamber of the drawer.

A rack 10 including two modular microprocessor-based personal computer (PC) circuit board test systems 12A and 12B in accordance with the present invention is illustrated generally in FIG. 1. As described in greater detail below, upon the activation of an on/off switch, test systems 12A and 12B cause circuit board units under test therein to execute diagnostic software during a test cycle including a sequence of diagnostic phases. The temperature of the circuit board units under test and the power supply voltages applied to the units under test are varied during the diagnostic phases to simulate a range of operating environments. At the end of the test cycles, test systems 12A and 12B generate a display indicating whether the circuit board units under test completed or failed the functional test procedure.

Test system 12A is mounted in drawer 14 which is slidably supported within cabinet 16 by tracks 18. Test system 12B is similarly mounted to a drawer 14 within cabinet 16. Cabinets 16 are modular in design, and are configured to be stacked on top of one another and supported above the ground by a base 20. A pair of video display monitors 22, each connected to one of test systems 12A and 12B, are enclosed by a modular cabinet 24 which is configured to be stacked on top of the test system cabinets 16. Test systems 12A and 12B are identical to one another in the embodiment shown, and common reference numbers are used in FIG. 1 to indicate common features and components. The following description of test system 12A therefore applies to test system 12B as well.

Test system 12A and its drawer 14 can be described in greater detail with reference to FIGS. 2–5. As shown, drawer 14 includes an apertured base 32 supported by tracks 18, and an interior wall 34 which divides the drawer into a test chamber 36 and hardware compartment 38. A front wall of drawer 14 is formed by a clear polymer panel 40 and a faceplate 42. Clear polymer panel 40 encloses the front of test chamber 30 when drawer 14 is closed, yet allows technicians to observe circuit board units under test such as 41 (hereinafter "circuit board UUT 41" or "UUT 41") within the chamber. Faceplate 42 encloses the front of hardware compartment 38. Two cooling vents 44 extend through the back wall of cabinet 16 into test chamber 36. An electrostatic discharge-safe polymer mat 48 covers base 32, and includes apertures aligned with those of the base. Antistatic standoffs 50 are mounted to mat 48 to support the circuit board UUT 41. A tray 26 for supporting keyboard 28 and mouse 30 is slidably mounted to the underside of drawer 14.

Components of test system 12A mounted within hardware compartment 38 of drawer 14 include diskette drive 52, hard drive 54, power supply 56 and circuit boards 58. Control panel 60 is positioned on faceplate 42 and includes LED display 62, "TESTING" indicator lamp 64, "COMPLETE" indicator lamp 66, "FAILURE" indicator lamp 68, power on/off switch 70 and test mode program switch 72, all of which are interconnected to circuit boards 58. Control panel 60 also includes a diskette drive access door 74 and an electrostatic discharge (ESD) connector socket 76.

Components of test system 12A mounted within test chamber 36 of drawer 14 include heater 80, temperature sensor 82 and fans 84, all of which are interconnected to circuit boards 58. Heater 80 is an elongated resistive-type device positioned in a zig-zag pattern below mat 48. When turned on, heater 80 heats test chamber 36 and the circuit board UUT 41 located therein. The temperature within test chamber 36 is monitored by sensor 82. Fans 84 are positioned adjacent to vents 44, and when turned on by test system 12A induce an air flow through the apertures in base 32 and test chamber 36 to cool the circuit board UUT 41. UUT 41 is interconnected to the power supply 56 and circuit boards 58 in a conventional manner by cables 85.

Figure 6:
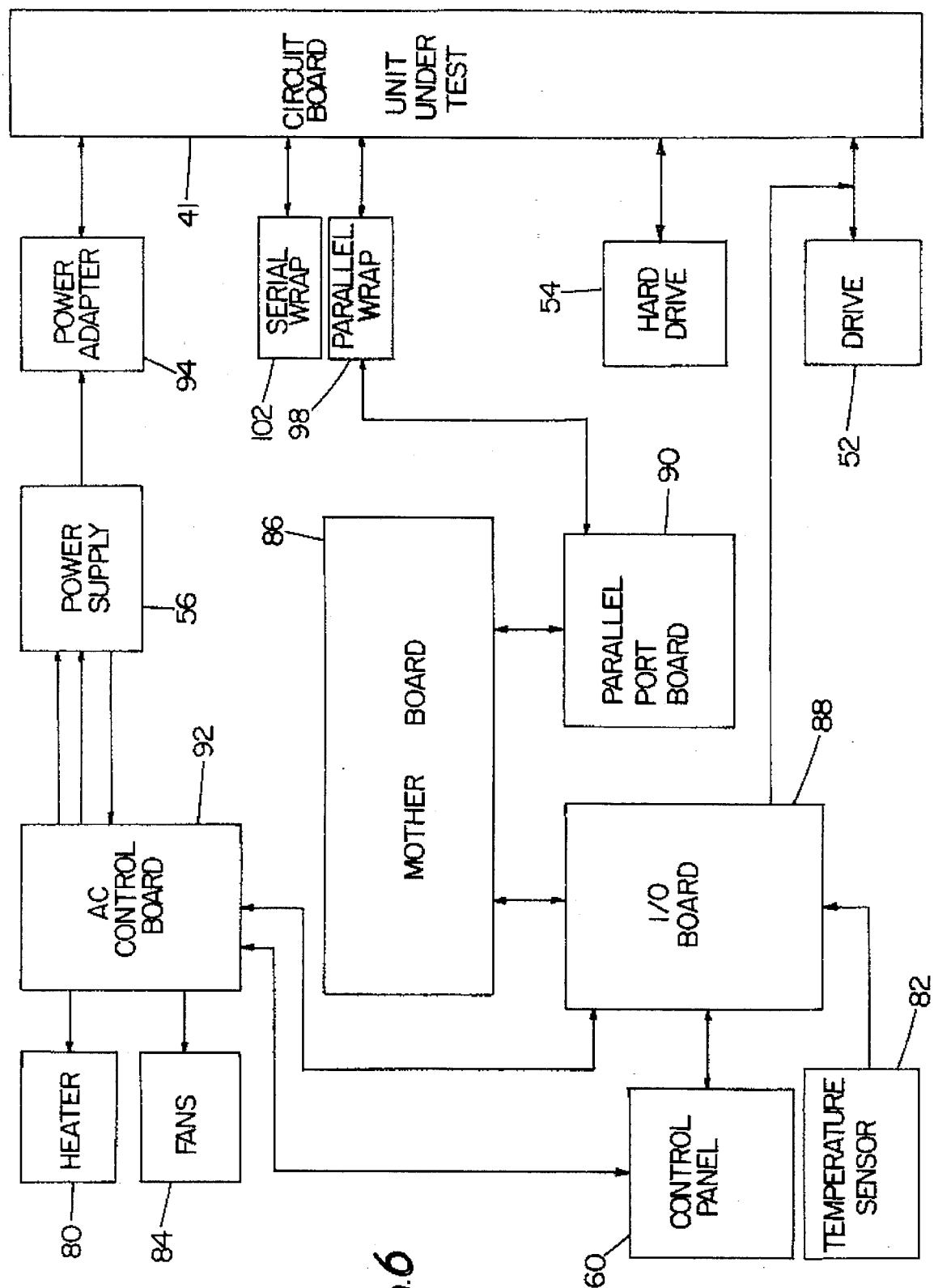
FIG. 6 is a detailed block diagram of the hardware components of the test system shown in FIG. 2, and their interconnection to a circuit board unit under test.

Test system 12A can be described in greater detail with reference to FIG. 6. The circuit boards 58 described generally above include a 386 microprocessor-based mother board 86 interfaced to an I/O board 88 and a parallel port board 90, and an AC control board 92 which is interfaced to the I/O board. Functions implemented on motherboard 86 include watchdog timers and a real time clock (not separately shown). I/O board 88 includes programmable read only memory (PROM) in which the test system control program is stored in firmware. I/O board 88 is also interfaced to the control panel 60 and temperature sensor 82, and provides communications between mother board 86 and the control panel, temperature sensor and AC control board 92. In particular, I/O board 88 reads the real time clock and watchdog timer values from mother board 86, reads the status of program switch 72 on operator panel 60, reads temperature signals from sensor 82, and drives LED display 62 and indicator lamps 64, 66 and 68 on the control panel. AC control board 92 is interfaced to heater 80, fans 84 and power supply 56, and controls these components in response to communications from I/O board 88.

AC control board 92 is functionally interconnected to the on/off switch 70 on control panel 60 and an external source of AC power (not shown). In response to relay control signals received from I/O board 88, AC control board 92 actuates relays (not separately shown) to control the application of AC power to power supply 56, heater 80 and fans 84. When supplied with AC power from AC control board 92, power supply 56 generates the DC power required by UUT 41. DC power from supply 56 is coupled to UUT 41 through power adapter 94. Power adapter 94 enables power supply 56 to be quickly and easily interconnected to UUTs 41 having differing types of power connectors. AC control board 92 also generates voltage control signals which are coupled to power supply 56 and cause the power supply to cyclically vary the voltage levels of the DC power supplied to UUT 41.

Software diagnostics and other programs to be executed by UUT 41 are stored on both hard drive 54 and a diskette (not shown) loaded into diskette drive 52. The nature of the software diagnostics and other programs to be run on UUT 41 will be different for different types of UUTs. Diskette drive 52 and hard drive 54 of test system 12A are interfaced directly to the drive controllers of UUT 41. In the event UUT 41 being tested within test system 12A does not include integrated drive controllers, an optional drive interface board (not shown in FIG. 6) is included to enable the interface between drives 52 and 54 and the UUT. Test system 12A exercises control over which drive 52 or 54 the UUT 41 reads or boots from (i.e., which drive is enabled) through a "disk not present" control signal coupled to the UUT from I/O board 88. Diskette drive 52 is typically the default drive from which UUT 41 will boot unless I/O board 88 generates a disk not present control signal.

Test system 12A communicates with the parallel port of UUT 41 through parallel port board 90 and parallel wrap 98. In the event the parallel port of UUT 41 lacks bidirectional capabilities, parallel port board 90 can be interfaced to the UUT through an optional parallel port interface board (not shown in FIG. 6). A loaded serial wrap 102 is connected to the serial ports of UUT 41 during the test procedure.

In the preferred embodiment described below, test system 12A is configured to functionally test IBM PS/2 and PS/2-compatible PC UUTs 41. Boot diskettes (not shown) to be used in diskette drive 52, and hard drive 54, are therefore loaded with the programs to be executed by the UUT 41 off the respective drive, including the operating system (e.g., DOS), application programs (e.g., Microsoft Windows) and diagnostic programs. Diagnostic programs loaded on the boot diskette and/or hard drive 54 include OEM diagnostic programs provided by the manufacturer of the UUT 41, and commercially available aftermarket diagnostics. In one embodiment, test system hard drive 54 is loaded with the QAPlus universal aftermarket diagnostic program which is commercially available from DiagSoft, Inc. of Scotts Valley, Calif. The QAPlus program is used by system 12A to test the overall functionality of UUT 41 and the associated video functions of the UUT.

The boot diskette and hard drive 54 also include several programs for configuring the UUT 41 and for fully automating the execution of the diagnostic programs. In one embodiment, the boot diskette and hard drive 54 include the freeware programs Batchman and Stuffit which are available to the public through the EDN (Electronic Design News) bulletin board, as well as the Winbatch program which is commercially available from Wilson WindWare of Seattle, Wash. As described in greater detail below, UUT 41 uses the year date in the calendar of the UUT as a pointer to identify which diagnostic phase of the test procedure was most recently performed. The Batchman program is a utility executed by UUT 41 to determine the year date in the calendar of the UUT. As UUT 41 exits the Batchman program, it sets an error level as a function of the pointer that can be accessed by the DOS batch programs. The Stuffit program is a keystroke driver utility used to automate the execution of diagnostic and other application programs being run on UUT 41. The Stuffit program sends the keystrokes to UUT 41 at the appropriate times. The Stuffit program also reads error codes and other messages displayed on display 62 and reboots the UUT 41. The Winbatch program is a utility that automatically runs the Windows application program.

Other programs loaded onto the boot diskette and hard drive 54 include batch files, Portsend and Posterrs. The batch files include a conventional autoexec.bat file for automatic execution, and config.stf, diags.stf, qadiags.stf, qavideo.stf and sys.wbt files. Config.stf is a stored set of keystrokes called by the Stuffit program to automate the execution of the configuration utility by UUT 41. Diags.stf is a stored set of keystrokes called by the Stuffit program to automate the execution of the OEM diagnostic programs by the UUT 41. Qadiags.stf is a stored set of keystrokes called by the Stuffit program to automate the execution of the QAPlus diagnostic program when used to test the overall functionality of the UUT 41. Qavideo.stf is a stored set of keystrokes called by the Stuffit program to automate the execution of the QAPlus diagnostic program used to test the video functions of UUT 41. Similarly, sys.wbt is a stored set of keystrokes called by the Winbatch utility to automate the execution of the Windows program.

Portsend is an assembly language program (written in Microsoft Macro Assembler 5.0) run on the UUT 41 to enable communications between the batch file programs run on the UUT 41 and mother board 86 of test system 12A. The Portsend program is configured to receive command-line parameters, and to return one value as the error-level to DOS. Commands executable by the Portsend program are defined in the firmware descriptions of test system 12A. The Portsend program puts the command-line parameters in a communication format acceptable to the controller on motherboard 86. Functions performed by the Portsend program include:

1. Parsing the command line parameters and converting ASCII decimal numbers to binary format.

2. Determining the first available LPTx parallel port in a sequence beginning with LPT3 and proceeding downwardly to LPT1.

3. Determining if the UUT 41 is an IBM PS/2 or compatible board requiring special system register setup.

4. Handling communication message generation, execution, responses and errors.

5. Intermediary processing required by certain commands.

Communications between test system 12A and UUT 41 take place over the data lines between parallel port board 90 and the parallel port interface of the UUT. Communications are initiated by UUT 41.

Test system 12A monitors communications from UUT 41 by sensing a header byte on the parallel port interface of the UUT. If the header byte is identified, the next two header bytes are checked for validity before receiving the command. A return signal is communicated to UUT 41 over the parallel port interface to indicate good or bad communications. Test system 12A then processes properly received commands. Commands made by UUT 41 during the operation of test system 12A include:

1. Get done testing status.
2. Send current time.
3. Receive current time.
4. Check current time.
5. Begin new task.
6. End current task.
7. UUT detected an error.
8. Cycle UUT power.
9. Set UUT power low, nominal or high.
10. Set test chamber temperature to cold, hot or cycle modes.
11. Set hard drive boot mode.
12. Set diskette drive boot mode.
13. Send current date.
14. Receive current date.
15. Set user option mode.
16. Send test pattern data.
17. Get talk/communication count.

Posterrs is an assembly language program (written in Microsoft Assembler 5.0) executed to access and display the power-on-self-test (POST) log maintained inside an IBM PS/2 or compatible UUT 41. When booted, a PS/2 or compatible UUT 41 automatically executes a POST software program. Under normal operating conditions (e.g., when not being tested by test system 12A), a UUT 41 of this type would discontinue processing and display an error message if an error was identified during the POST. The Posterrs program is run by UUT 41 to determine if any such errors were identified during the execution of the POST.

The test system control program executed by test system 12A is an assembly language program (written in Microsoft Macro Assembler 5.0) stored in an option PROM on I/O board 88. The test system control program acquires control over the operation of test system 12A after mother board 86 completes its own power-on-self-test. The test system control program does not utilize DOS, which is never loaded, but does use some BIOS calls to access the real time clock on the mother board 86.

Test system 12A is manually set up by a technician to test a UUT 41. The technician will begin the setup procedure by plugging an ESD grounding strap into socket 76 and opening drawer 14. The UUT 41 is positioned in drawer 14 on standoffs 50, and wrap plugs 98 and 102 and the power supply and communication cables 85 required to test all the I/O ports are plugged into the UUT. After UUT 41 is fully interconnected to test system 12A, drawer 14 is closed. The appropriate boot diskette (not shown) for the UUT 41 is then loaded into diskette drive 52 through door 74.

Figure 7:
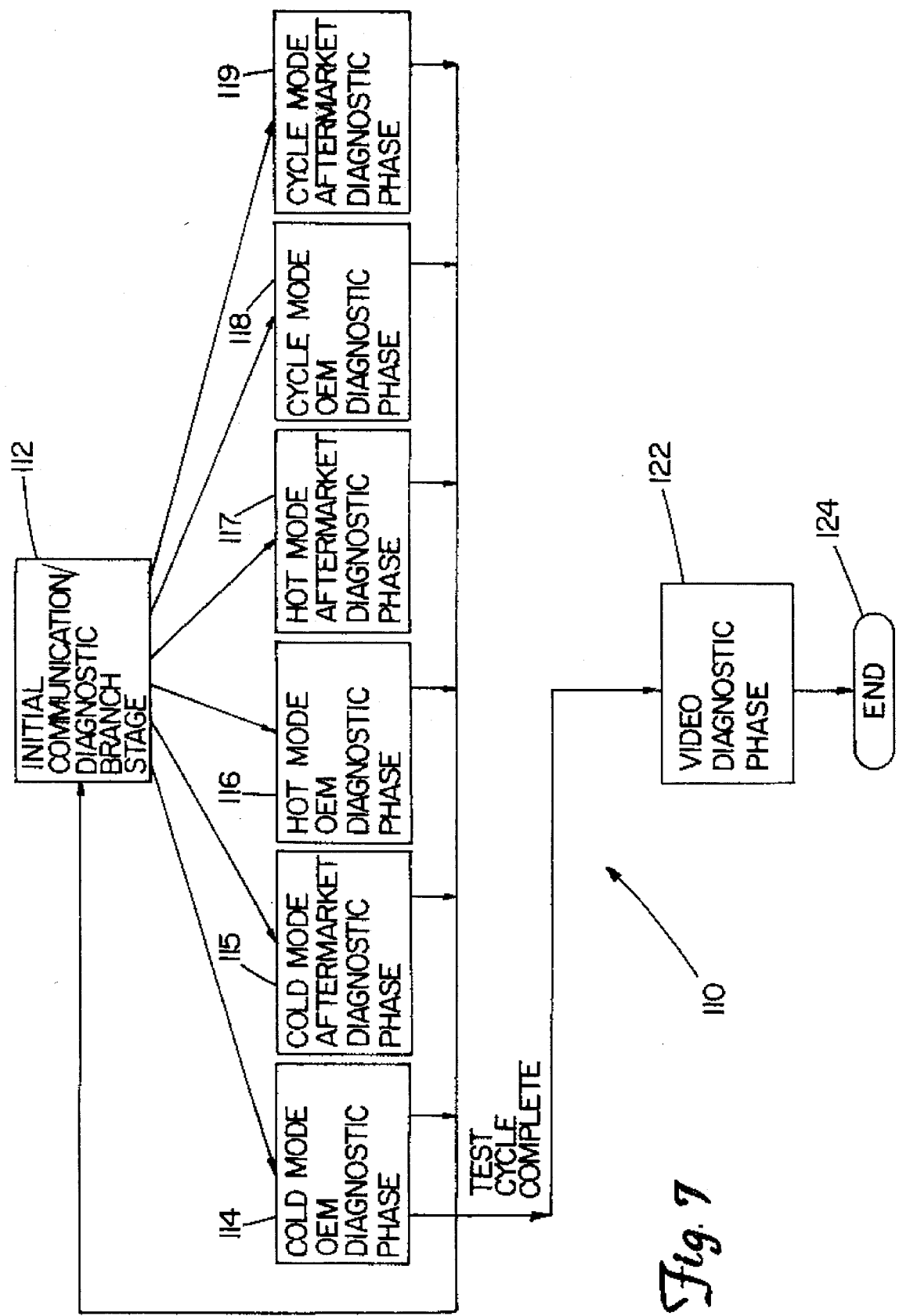
FIG. 7 is a flow diagram of the test procedure performed by the test system shown in FIG. 6.

FIG. 7 is a flow diagram of the functional test procedure 110 performed by test system 12A. Functional test procedure 110 is initiated when the technician turns on switch 70 following the setup procedure, and begins with an initial communication/diagnostic branch stage 112. Initial communication/diagnostic branch stage 112 begins with test system 12A performing a number of internal initialization operations. Test system 12A then applies power to UUT 41, thereby causing the UUT to boot off of diskette drive 52 or hard drive 54, and to read and execute the autoexec.bat file programs. UUT 41 is also configured during initial communication/diagnostic branch stage 112 if power is being applied for the first time following the actuation of on/off switch 70 by the technician.

Test system 12A causes UUT 41 to sequentially and repeatedly performs several diagnostic phases 114–119 during each test cycle of procedure 110. The sequence in which diagnostic phases 114–119 are performed is controlled by initial communication/diagnostic branch stage 112. While performing diagnostic phase 114, UUT 41 also determines whether the test cycle is complete. If the test cycle is incomplete, initial communication/diagnostic branch stage 112 is repeated. Following the completion of the test cycle, test system 12A initiates the execution of video diagnostic phase 122. As indicated by step 124, the test procedure 110 ends following the completion of video diagnostic phase 122.

Test system 12A can be operated in either of two test cycle modes: 1) normal mode; and 2) manual power off mode. The test cycle mode is selected by the technician through the actuation of program switch 72. When normal test cycle mode is selected, test system 12A displays test cycle mode code "00" on LED display 62 and starts a test cycle software timer to time a twelve hour test cycle. In effect, initial communication/diagnostics branch stage 112 and diagnostic phases 114–119 are sequentially repeated for a twelve hour period when test system 12A is operated in the normal test cycle mode. When the manual power off test cycle mode is selected, test system 12A displays test cycle mode code "01" on LED display 62 and continually repeats initial communication/diagnostic branch stage 112 and diagnostic phases 114–119 until on/off switch 70 is turned off.

In addition to the test cycle modes, program switch 72 can be actuated to select a test chamber temperature status mode and a test system reset mode. When the test chamber temperature status mode is selected, test system 12A displays mode code "03" on LED display 62, followed by a digit "1" if test chamber 36 is hot (e.g., if heater 80 is on or if the temperature is greater than a predetermined level), or a "00" display if the test chamber is cold. Test system 12 displays mode code "04" on LED display 62 when the reset mode is selected, and restarts test procedure 110 at the beginning of initial communication/diagnostic branch stage 112.

During cold mode OEM diagnostics phase 114, UUT 41 causes test system 12A to maintain test chamber 36 at a first or relatively cold temperature while executing the OEM diagnostics program. In the embodiment shown, UUT 41 maintains the test chamber 36 at ambient room temperature during phase 114 by turning on fans 84 and drawing ambient air through the test chamber. During the cold mode aftermarket diagnostics phase 115, UUT 41 executes the aftermarket diagnostics program while maintaining test chamber 36A at ambient room temperature by running fans 84.

During hot mode OEM diagnostics phase 116, UUT 41 causes test system 12A to maintain test chamber 36 at a second or relatively hot temperature while executing the OEM diagnostics program. Test system 12A uses sensor 82 to monitor the temperature within test chamber 36, and regulates the temperature by actuating heater 80. Test chamber 36 is maintained at a temperature of about fifty degrees Centigrade during hot mode diagnostics phase 116 in one embodiment. During hot mode aftermarket diagnostics phase 117, UUT 41 executes the aftermarket diagnostics program while maintaining test chamber 36 at the relatively hot temperature in the manner described immediately above.

During cycle mode OEM diagnostics phase 118, UUT 41 causes test system 12A to cycle or vary the temperature in test chamber 36 between the relatively cold and relatively hot temperatures while causing the UUT to run the OEM diagnostics program. Test system 12A cycles the temperature by alternately actuating fans 84 and heater 80. In one embodiment, test system 12A turns on heater 80 until test chamber 36 is heated to a relatively hot temperature of about 50 degrees Centigrade. Heater 80 is then turned off and fans 84 turned on for a predetermined period of about five minutes to bring test chamber 36 down to ambient temperature. This sequence of alternately actuating heater 80 and fans 84 is repeated throughout cycle mode OEM diagnostics phase 118. In a similar manner, UUT 41 executes the aftermarket diagnostics program while causing test system 12A to cycle test chamber 36 between the relatively hot and relatively cold temperatures during cycle mode aftermarket diagnostics phase 119.

Test system 12A also continually cycles or varies the DC power supply voltage applied to UUT 41 during all diagnostics phases 114–119. In one embodiment in which the manufacturer's specifications for UUT 41 call for a nominal power supply of 5.0 volts, test system 12A varies the supply voltage over a range of about five percent between about 4.8 volts and 5.2 volts at a period of about one minute.

Figure 8A:
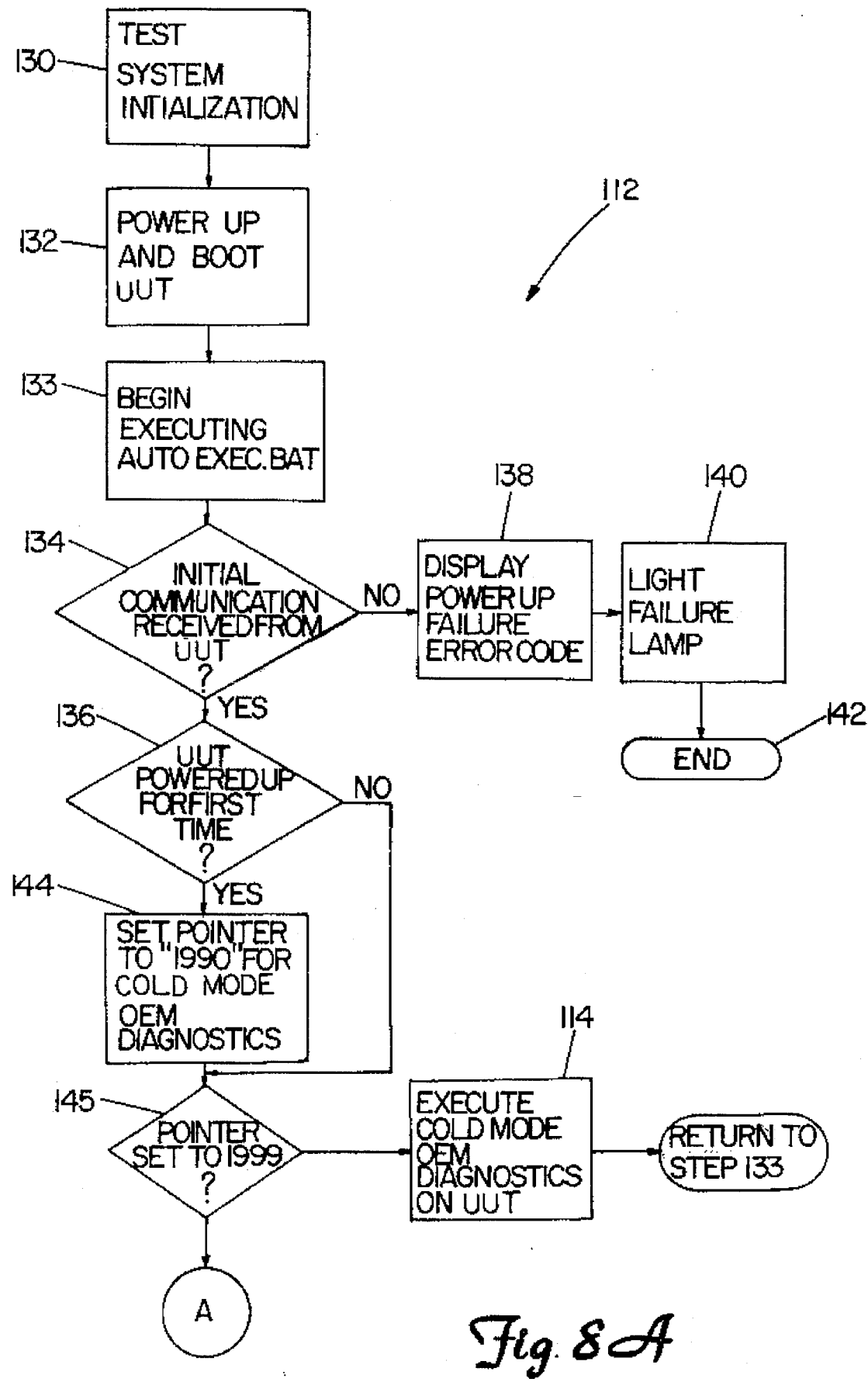
FIGS. 8A–8C are flow diagrams of the initial communication/diagnostic branch stage of the test procedure shown in FIG. 7.
Figure 8B:
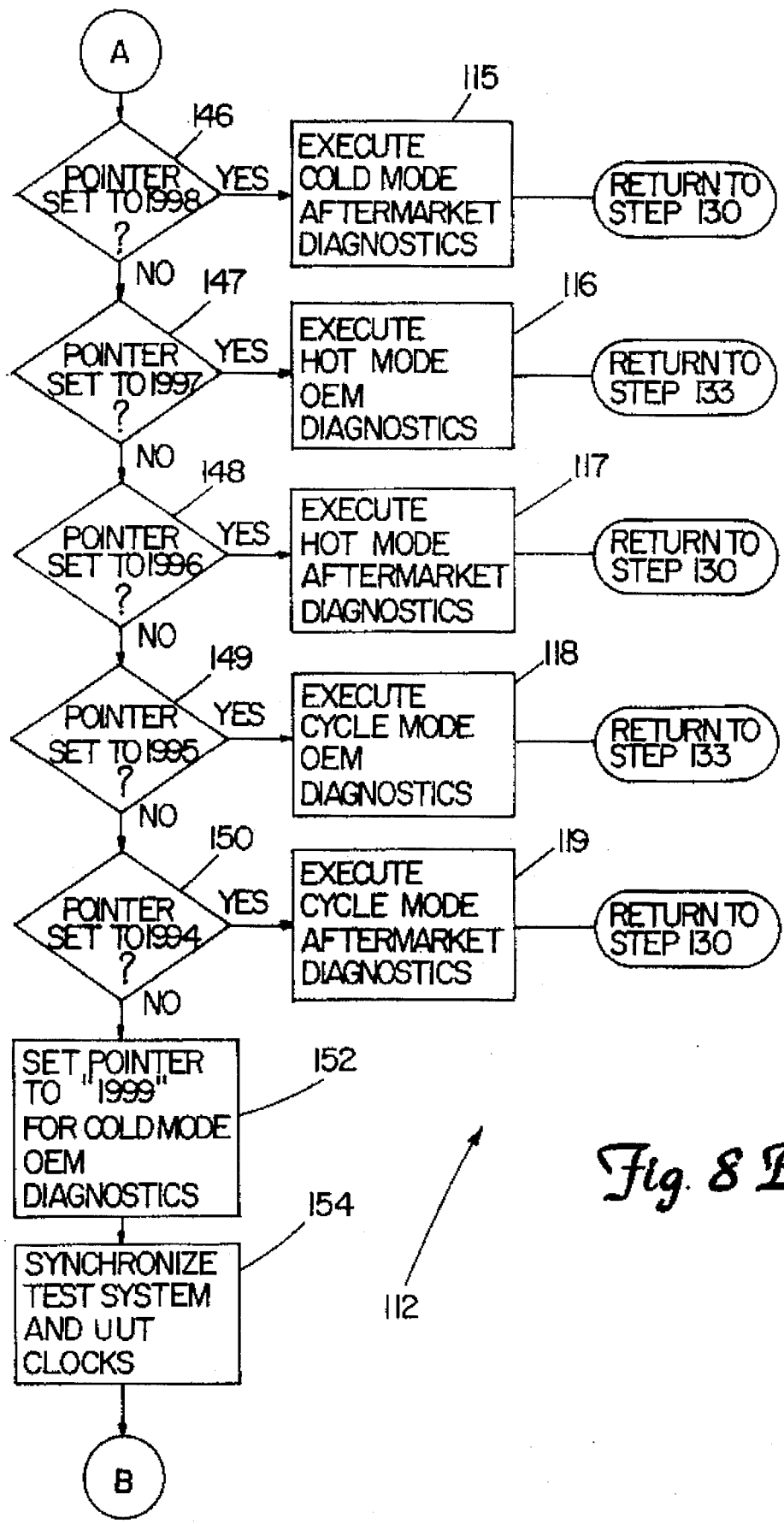
Figure 8C:
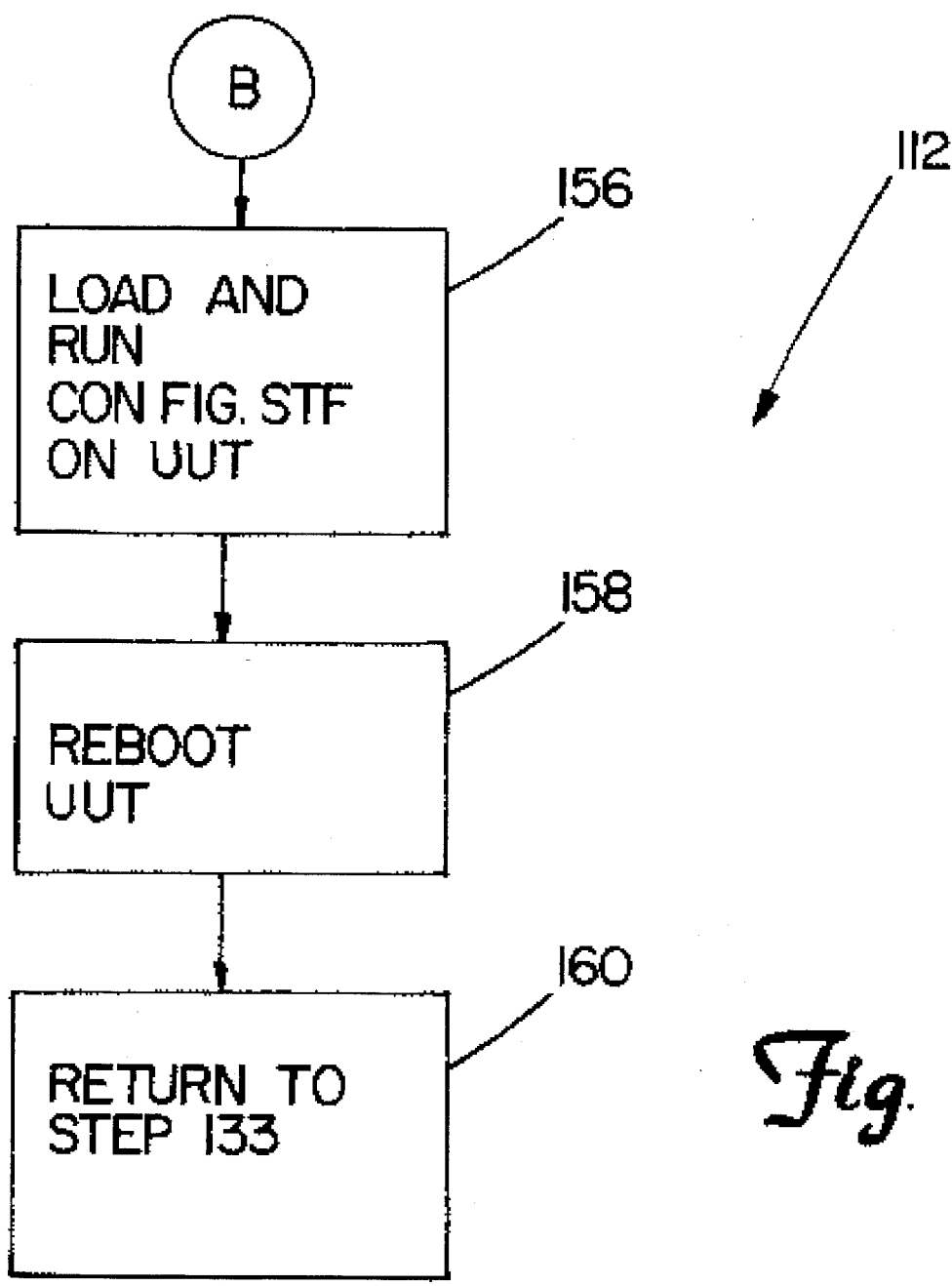

Initial communication/diagnostic branch stage 112 can be described in greater detail with reference to FIGS. 8A–8C. The first time initial communication/diagnostic branch stage 112 is executed following the actuation of on/off switch 70, and each time the initial communication/diagnostic branch stage is executed thereafter following a power-down of UUT 41 (i.e., following diagnostic phases 115, 117 and 119), stage 112 starts with test system 12A performing a number of test system initialization functions as shown by step 130. The functions performed by test system 12A at step 130 include:

1. Copying the test control program data area from the PROM into random access memory (RAM, not separately shown in FIG. 6).
2. Hooking into the 1C hex interrupt on mother board 86 as a programmable timer (i.e., "time-of-day tick") that can be counted by DOS.
3. Initializing the driver board registers (not separately shown in FIG. 6).
4. Performing a blink test on LED display 62 and lamps 64, 66 and 68 of control panel 60.
5. Monitoring and responding to the actuation of program switch 72.
6. Displaying on LED display 62 the current version level of the test system control program firmware stored in PROM.

7. Clearing LED display 62.
8. Turning off the parallel port drivers (not separately shown in FIG. 6) of mother board 86.
9. Starting a five minute watchdog timer to check for the receipt of initial communications from UUT 41.
10. Echoing data from the parallel port of UUT 41 to LED display 62.

Following the completion of the initialization functions at step 130, test system 12A applies power to UUT 41 as shown at step 132. Once powered up, UUT 41 boots from diskette drive 52 or hard drive 54 (whichever is currently enabled) and loads DOS and the autoexec.bat file. UUT 41 boots from diskette drive 52 (the default drive) the first time the UUT is powered up at step 132 following the actuation of on/off switch 70. UUT 41 begins executing the autoexec.bat file programs after this file is loaded as shown by step 133.

Test system 12A monitors the receipt of initial communications from UUT 41 during the five minute period as shown by step 134. If UUT 41 successfully executes its power-on-self-test the UUT will initiate communications with test system 12A within the five minute period. UUT 41 then continues the execution of its autoexec.bat file with step 136. The failure to receive initial communications from UUT 41 during this five minute period indicates that the UUT was unsuccessful at its attempt to power up. Under these circumstances, test system 12A displays a power up failure error code "01" on LED display 62 (step 138) and lights the red failure lamp 68 (step 140) before ending the execution of the test system control program (step 142). Test system 12A alternates the display of the power up failure error code with error codes generated by UUT 41 during the UUT POST.

At step 136, UUT 41 determines whether it is being powered up and is initializing communications for the first time following the actuation of on/off switch 70 (i.e., whether stage 112 is being executed for the first time on the UUT). The calendar in UUT 41 is used as a pointer to control the diagnostic phase branching operation during the execution of initial communication/diagnostic branch stage 112. If at step 136 it is determined that UUT 41 was powered up for the first time, UUT 41 sets its calendar to the year "1990" (step 144). This action causes UUT 41 to bypass the execution of diagnostic phases 114–119 while executing branch decision steps 145–150 the first time the UUT is powered up, and to first configure the UUT by executing steps 152, 154 and 156.

At step 152, the UUT 41 calendar is set to the year date "1999" so the cold mode OEM diagnostics phase 114 will be executed following branch decision step 145 during the next execution of initial communication/diagnostic branch stage 112. The clock on UUT 41 is set to the same value as the real time clock (RTC) on test system 12A so the accuracy of the UUT clock can be subsequently tested (step 154). As shown at step 156, UUT 41 loads the config.stf file, and executes the Stuffit program with the config.stf file to automatically run the configuration program on the UUT. In the event UUT 41 does not have the capability of being automatically configured, the technician will manually configure the UUT at step 156 using keyboard 28. After UUT 41 is configured at step 156, the UUT reboots (step 158). Initial communication/diagnostic branch stage 112 is then repeated beginning with step 133.

During the second execution of initial communication/diagnostic branch stage 112, UUT 41 will begin executing the autoexec.bat file as shown by step 133. Assuming communications are received at step 134, UUT 41 will branch to decision step 145 since the UUT was previously powered up. As described above, the calendar pointer was set to year date "1999" during the first execution of initial communication/diagnostic branch stage 112. UUT 41 will therefore branch to cold mode OEM diagnostic phase 114 at decision step 145.

Figure 9A:
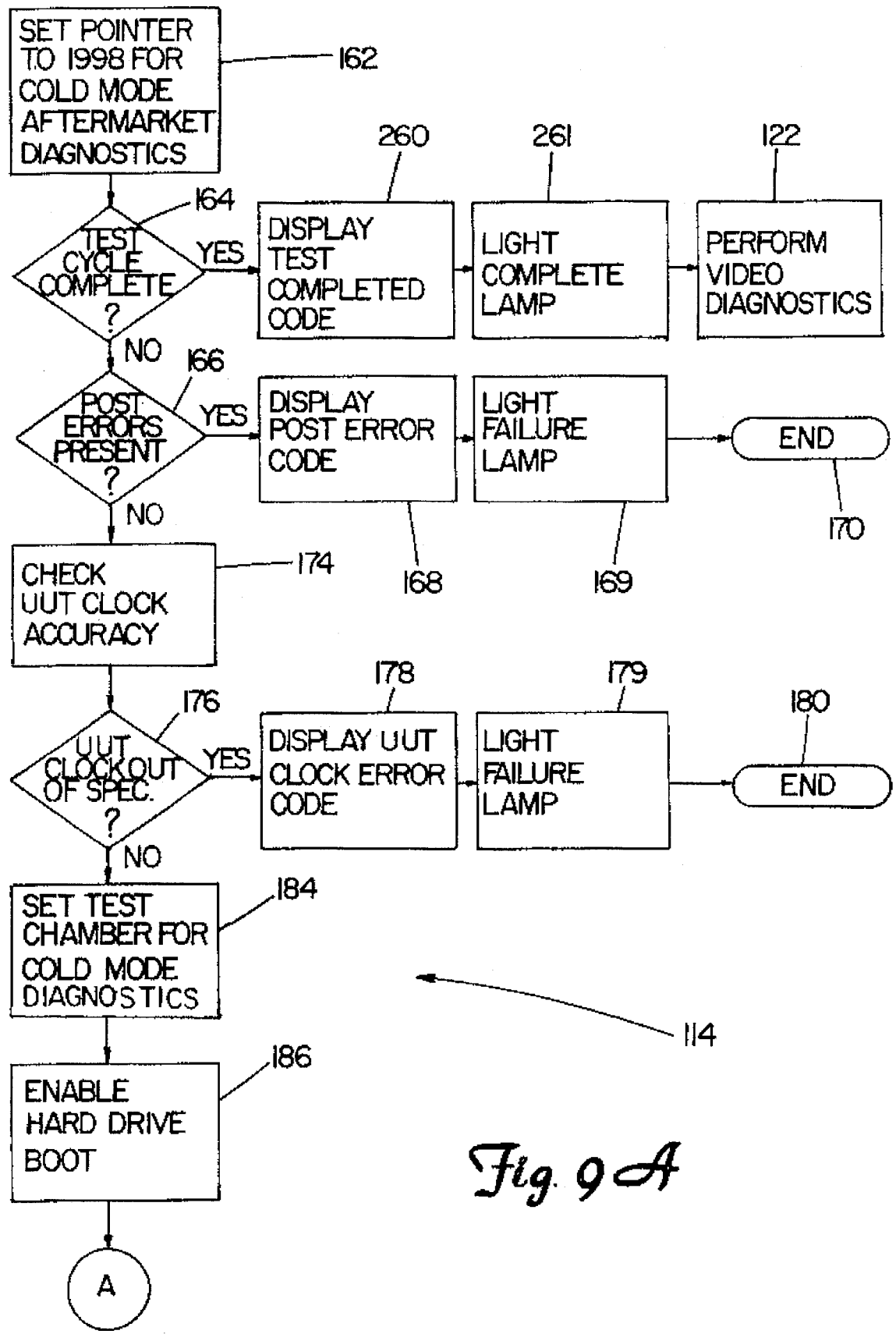
FIGS. 9A–9B are flow diagrams of the cold mode OEM diagnostics phase of the test procedure shown in FIG. 7.
Figure 9B:
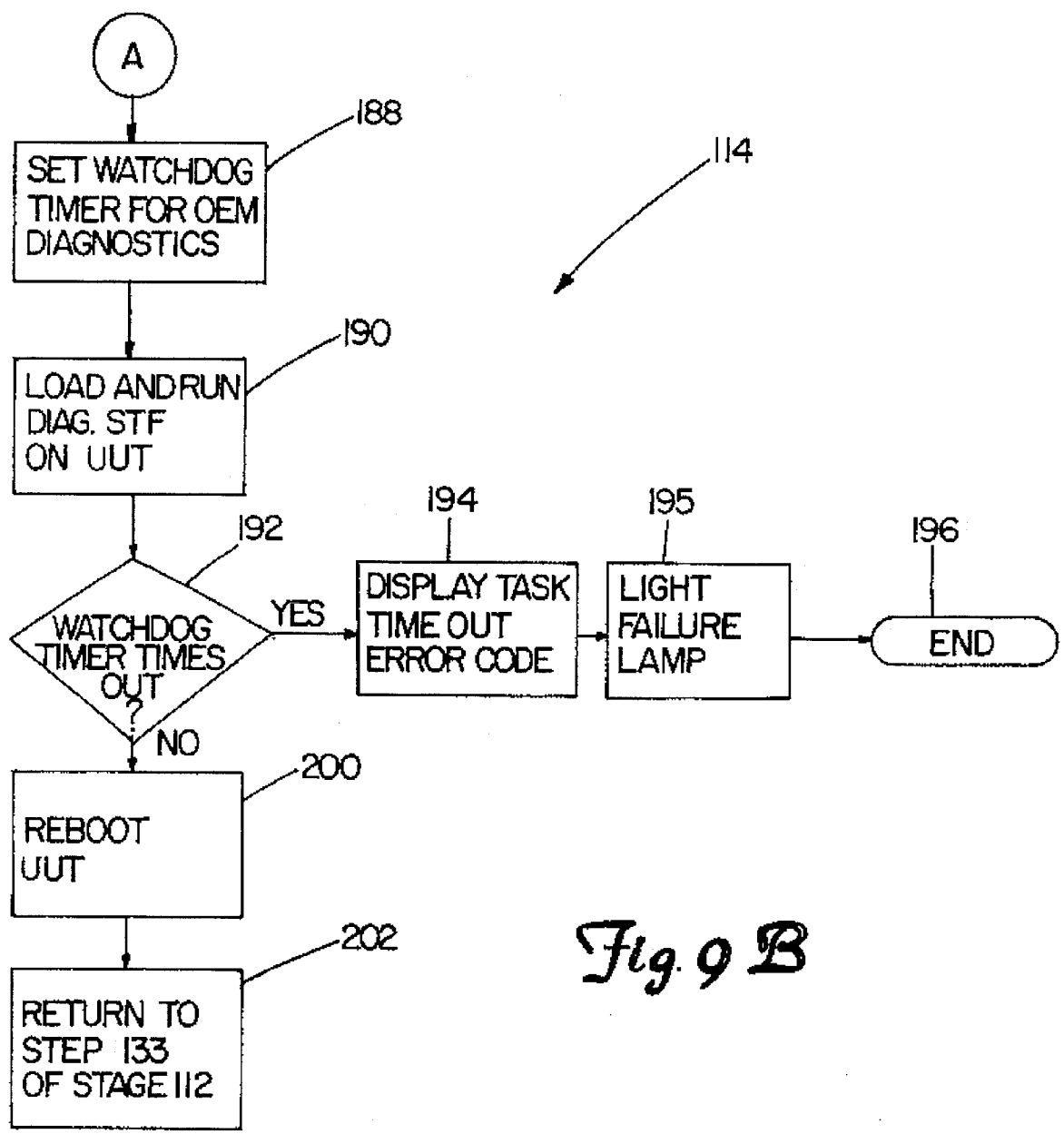

Cold mode OEM diagnostic phase 114 can be described with reference to FIGS. 9A–9B. Diagnostic phase 114 begins with UUT 41 setting its calendar pointer to "1998" at step 162. The Portsend program is then run at step 164 to determine whether the test cycle for the selected test cycle mode has been completed. If the test cycle has been completed, test system 12A branches to video diagnostics phase 122 which is described in greater detail below. If the test cycle has not been completed, the Posterrs program is run at step 166 to determine if UUT 41 logged any errors while performing its POST. Test system 12A displays a post error code "FE" on display 62 (step 168) and lights failure lamp 68 (step 169) before ending the test procedure (step 170) if any power-on-self-test errors were identified.

If no POST errors were identified at step 166, the accuracy of the real time clock of UUT 41 is determined as shown at step 174. Step 174 is implemented by using the Portsend program to determine the time on the real time clock of UUT 41, and comparing the UUT clock time to the clock time of test system 12A. If the clock of UUT 41 is not within a predetermined specification (e.g., within five seconds of the clock of test system 12A in one embodiment), the test system displays a real time clock error code "FD" on display 62 and lights failure lamp 68 before ending the test procedure as shown by steps 178–180. If the clock of UUT 41 is within specification, test system 12A turns on fans 84 at step 184 to cool test chamber 36.

Before running the OEM diagnostics, a delay is set on the diskette not present line of UUT 41 so the UUT will boot off hard drive 54 during the execution of the following diagnostic phase 115 (step 186). The watchdog timer of test system 12A is also set as shown by step 188. UUT 41 then loads the diag.stf file, and executes the Stuffit program with the diag.stf file to automatically run the OEM diagnostics on the UUT (step 190). During the execution of the OEM diagnostics at step 190, all graphic displays generated by the OEM diagnostic program will be displayed on monitor 22. Faults and other information identified by the OEM diagnostics can therefore be reviewed by the technician.

The watchdog timer is set at step 188 for a period of time that will be sufficient allow UUT 41 to complete the OEM diagnostics if the UUT is operating properly. If UUT 41 is unable to successfully complete the OEM diagnostics, the watchdog timer will time out at step 192. Test system 12A then displays a task timeout error code "03" on display 62 and lights failure lamp 68 before ending the test procedure as shown by steps 194–196. If the OEM diagnostics are successfully completed, UUT 41 reboots. Since a hard drive boot was enabled at step 186, UUT 41 will boot off of hard drive 54 during step 200. Initial communication/diagnostic is branch stage 112 then repeated beginning with step 133.

During the third execution of initial communication/diagnostic branch stage 112, UUT 41 will again begin executing the autoexec.bat file at step 133. Assuming communications are received at step 134, UUT 41 will branch to decision step 145 since the UUT was previously powered up. As described above, the calendar pointer was set to the year date "1998" during the execution of cold mode OEM diagnostics stage 114. UUT 41 will therefore branch to cold mode aftermarket diagnostics phase 115 at decision step 146.

Figure 10A:
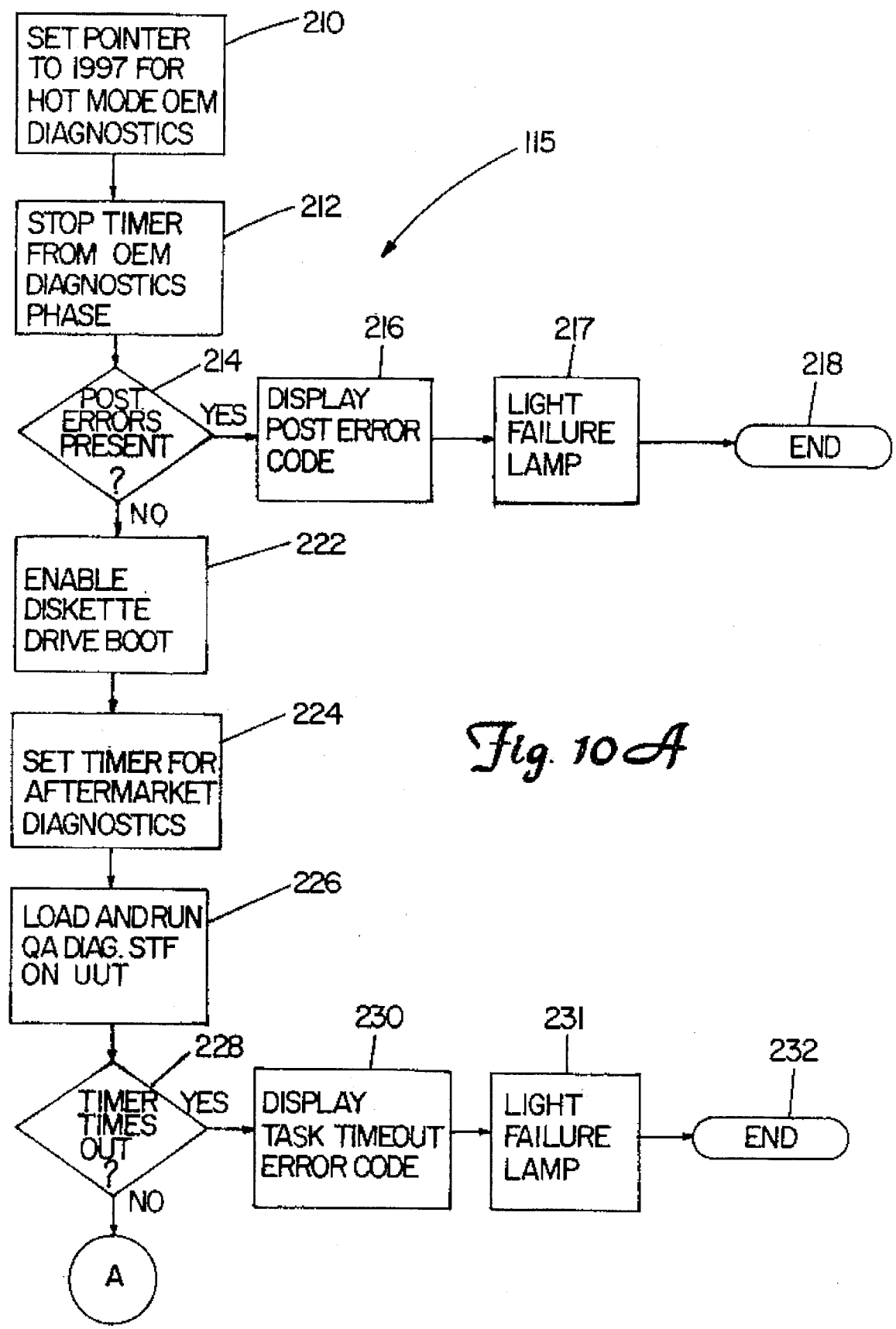
FIGS. 10A–10B are flow diagrams of the cold mode aftermarket diagnostics phase of the test procedure shown in FIG. 7.
Figure 10:
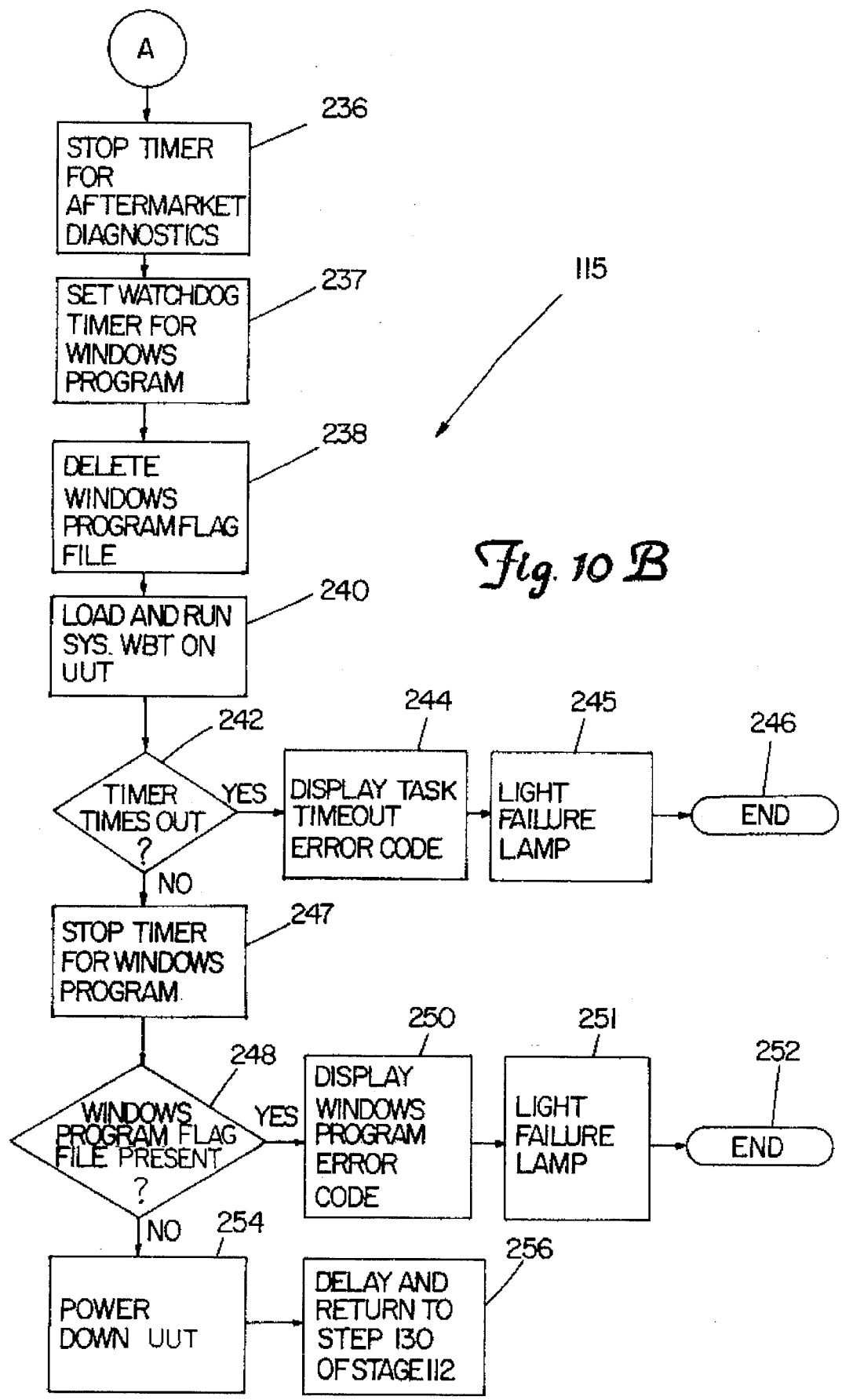

Cold mode aftermarket diagnostic phase 115 can be described with reference to FIGS. 10A–10B. Diagnostics phase 115 begins with UUT 41 setting its calendar pointer to "1997" at step 210. The Portsend program is also used to stop the watchdog timer set during cold mode OEM diagnostics phase 114 as shown by step 212. The Posterrs program is then run at step 214 to determine if UUT 41 logged any errors while performing its power-on-self-test. Test system 12A displays a POST error code "FE" on display 62 (step 216) and lights failure lamp 68 (step 217) before ending the test procedure (step 218) if any power-on-self-test errors were identified.

Since diskette drive 52 was disabled at step 186 to obtain a reboot from hard drive 54 at step 200 of the preceding diagnostics phase 114, diskette drive 52 is enabled at step 222 so the diskette interface can be tested by the aftermarket diagnostics program. At step 224 the watchdog timer of test system 12A is set for a time period that will be sufficient to enable UUT 41 to complete the aftermarket diagnostics if the UUt is functioning properly. UUT 41 then loads the qadiags.stf file, and executes the Stuffit program with the qadiag.stf file to automatically run the aftermarket diagnostics on the UUT (step 226). During the execution of the aftermarket diagnostics at step 226, all graphic displays generated by the aftermarket diagnostics program will be displayed on monitor 22. Faults and other information identified by the aftermarket diagnostics can therefore be reviewed by the technician. If UUT 41 is unable to successfully complete the aftermarket diagnostics, the watchdog timer will time out at step 228. Test system 12A then responds and displays a task timeout error code "03" on display 62 and lights failure lamp 68 before ending the test procedure as shown by steps 230–232. If the aftermarket diagnostics are successfully completed by UUT 41, the watchdog timer is stopped at step 236.

The ability of UUT 41 to properly run the Windows application program is also tested by test system 12A during aftermarket diagnostics phase 115. The Windows program test procedure begins by setting the watchdog timer for a time period that is sufficient to enable UUT 41 to complete the Windows program test procedure if the UUT is functioning properly (step 237). The Windows program flag file in UUT 41 is used to indicate the execution of the Windows program, and is deleted at step 238. UUT 41 then loads the sys.wbt file, and executes the Winbatch program with the sys.wbt file to automatically run the Windows program on the UUT (step 240). During the execution of the Windows program at step 240, all graphic displays generated by the program will be displayed on monitor 22. Faults and other information generated by the Windows program can therefore be monitored by the technician. If UUT 41 is unable to successfully execute the Windows program, the watchdog timer will time out at step 242. Test system 12A then displays a task timeout error code "03" on display 62 and lights failure lamp 68 before ending the test procedure as shown by steps 244–246. If the watchdog timer does not time out and test system 12A responds to communications from UUT 41, the test system stops the watchdog timer at step 247.

The presence of the Windows program flag file is also checked at step 248. If the flag file is not present (e.g., if the UUT 41 never loaded and executed the Windows program), test system 12A displays Windows program error code "FC" on display 62 and lights failure lamp 68 before ending the test procedure as shown by steps 250–252. If the aftermarket diagnostic and Windows programs are successfully completed, diagnostics phase 115 is completed by powering down UUT 41 as shown at step 254. Following a delay intended to simulate the time period prior to an overnight cold restart of UUT 41 (about five minutes in one embodiment), initial communication/diagnostic branch stage 112 is repeated by UUT 41, beginning with step 130 (step 256).

During the fourth execution of initial communication/diagnostic branch stage 112, UUT 41 will branch to hot mode OEM diagnostics phase 116 at decision step 147 after starting at step 130. Hot mode OEM diagnostics phase 116 is performed in a manner similar to cold mode OEM diagnostics phase 114 described above, but with test system 12A controlling heater 80 to maintain test chamber 36 at the relatively hot temperature. The calendar pointer is also set to "1996" (i.e., at the step of phase 116 corresponding to step 162 of phase 114) to initiate the performance of hot mode aftermarket diagnostic phase 117 during the following execution of initial communication/diagnostic branch stage 112.

During the fifth execution of initial communication/diagnostic stage 112, UUT 41 will branch to hot mode aftermarket diagnostics phase 117 at decision step 148. Hot mode aftermarket diagnostics phase 117 is performed in a manner similar to cold mode aftermarket diagnostics 115 described above, but with test system 12A controlling heater 80 to maintain test chamber 36 at the relatively hot temperature. The calendar pointer is also set to "1995" (i.e., at the step of phase 117 corresponding to step 210 of phase 115) to initiate the performance of cycle mode OEM diagnostics phase 118 during the following execution of initial communication/diagnostic branch stage 112.

During the sixth execution of initial communication/diagnostic branch stage 112, UUT 41 will branch to cycle mode OEM diagnostics phase 118 at decision step 149. Cycle mode OEM diagnostics phase 118 is performed in a manner similar to cold mode OEM diagnostics phase 114 described above, but with test system 12A controlling heater 80 and fans 84 to vary the temperature within test chamber 36. The calendar pointer is also set to "1994" (i.e., at the step of phase 118 corresponding to step 162 of phase 114) to initiate to performance of cycle mode aftermarket diagnostic phase 119 during the following execution of initial communication/diagnostic branch stage 112.

During the seventh execution of initial communication/diagnostic branch stage 112, UUT 41 will branch to cycle mode aftermarket diagnostics phase 119 at decision step 150. Cycle mode aftermarket diagnostics phase 119 is performed in a manner similar to cold mode aftermarket diagnostics 115 described above, but with test system 12A controlling heater 80 and fans 84 to vary the temperature with test chamber 36. The calendar pointer is also set to "1999" (i.e., at the step of phase 119 corresponding to step 210 of phase 115) to initiate the performance of cold mode OEM diagnostics phase 114 during the next execution of initial communication/diagnostic branch stage 112.

Test system 12A repeats the execution of initial communication/diagnostic branch stage 112 and diagnostic phases 114–119 in the manner described above for the duration of the selected test cycle mode. In one embodiment, test system 12A requires about one hour to complete both cold mode diagnostic phases 114 and 115, about one hour to complete both hot mode diagnostic phases 116 and 117, and about one hour to complete both cycle mode diagnostic phases 118 and 119. Each of diagnostic phases 114–119 is therefore performed about four times during a twelve hour test cycle.

During the execution of step 164 of cold mode OEM diagnostics phase 114 (FIG. 9A), UUT 41 determines whether the test cycle of the selected test cycle mode has been completed. If the test cycle is complete, and if UUT 41 successfully executed the OEM diagnostic software and aftermarket diagnostic software during diagnostic phases 114–119 of the test cycle, test system 12A displays the test successfully completed code "00" on display 62 (step 260) and lights the green complete indicator lamp 66 (step 261). Test system 12A alternates the display of the test successfully completed code with a display of the number of hours of the test cycle. Video diagnostics phase 122 is then initiated by UUT 41.

Video diagnostics phase 122 is performed to evaluate the functionality of the video and graphics cards (not separately shown in FIG. 6) of UUT 41. When video diagnostics phase 122 is initiated, UUT 41 loads the qavideo.stf file, and executes the Stuffit program to automatically run the video diagnostic software of the QAPlus program. While this video diagnostic software is being run, the technician will observe the graphic displays presented on monitor 22 and note any color, attribute or other graphics problems. The mouse cursor movement can also be tested by selecting the interactive mouse test that is part of the QAPlus program. Test procedure 110 ends with the completion of video diagnostics 122.

The test system of the present invention offers considerable advantages. The test system effectively provides a "one button" go/no go circuit board functionality test. After setting up the UUT in the test chamber, the technician need only actuate the on/off switch once to initiate the test procedure. Other than occasionally observing the status of the test procedure by monitoring the testing, complete and failure lamps, no other actions on the part of the technician are required during the execution of the OEM and aftermarket software diagnostics. The technician will know that the test procedure is still being run when the white testing lamp is lit. If any board failures are identified during the test procedure, the technician will be notified by the lit red failure lamp. The video monitor and test system LED display can then be observed to determine the nature of the problem that caused the failure. The successful completion of the test procedure is indicated by the lit green complete lamp.

The test system consistently executes an extensive set of diagnostics while stressing the circuit board in a manner that will provide a high confidence indication of the UUT functionality. By executing the software diagnostics during cold, hot and cycling temperature modes, while the power supply voltage is varied, and after the UUT has been powered down and powered up, a wide variety of end-user environmental operating environments that can contribute to faults are simulated. Circuit boards subject to intermittent or latent faults can therefore be identified. The test system is also reliable and relatively inexpensive. Since it is convenient to use, many circuit boards can be tested simultaneously by a technician. All these factors will contribute to reduced warranty costs and increased end-user satisfaction.

Although the present invention has been described with reference to preferred embodiments, those skilled in the art will recognize that changes may be made in form and detail without departing from the spirit and scope of the invention.

What is claimed is:

1. A run-in test system for microprocessor-based circuit boards, including:

a test chamber for removably receiving a microprocessor-based circuit board unit under test (UUT);

a heating system for heating a UUT in the test chamber;

a cooling system for cooling a UUT in the test chamber;

a display;

memory for storing software, including:

UUT-executable self-diagnostic software; and

UUT-executable communication/diagnostic branch control software, including:

low temperature diagnostic phase software for generating low temperature control commands and causing a UUT to execute the self-diagnostic software at a relatively low temperature during a relatively low temperature diagnostic phase; and high temperature diagnostic phase software for generating high temperature control commands and causing a UUT to execute the self-diagnostic software at a relatively high temperature during a relatively high temperature diagnostic phase; and a control system adapted for interconnection to the UUT and coupled to the heating system, cooling system and display, including:

run-in test initiating means for causing the UUT to initiate the execution of the self-diagnostic software and the communication/diagnostic branch control software;

cooling system control means for causing the cooling system to cool the UUTs to a first temperature in response to the low temperature control commands;

heating system control means for causing the heating system to heat the UUTs to a second temperature greater than the first temperature in response to the high temperature control commands;

diagnostic software monitoring means for monitoring the UUT execution of the self-diagnostic software during the diagnostic phases; and display control means for causing the display to provide an indication of a run-in test failure if the UUT fails to successfully complete the execution of the self-diagnostic software during the diagnostic phases.

2. The run-in test system of claim 1 wherein the UUT-executable communication/diagnostic branch control software stored in the memory further includes software for causing the UUT to sequentially and repeatedly perform the relatively low temperature diagnostic phase and the relatively high temperature diagnostic phase.

3. The run-in test system of claim 2 wherein the control system includes test cycle timing means for causing the UUT to sequentially and repeatedly perform the relatively low and relatively high temperature diagnostic phases for a predetermined test cycle time period.

4. The run-in test system of claim 1 wherein:

the diagnostic software monitoring means of the control system includes a watchdog timer for timing watchdog periods during each relatively low and relatively high temperature diagnostic phase; and the display control means of the control system includes means for causing the display to provide an indication of a run-in test failure if the UUT fails to complete the execution of the self-diagnostic software during the watchdog periods.

5. The run-in test system of claim 1 wherein:

the control means further includes test cycle timing means for timing test cycles; and the display control means causes the display to provide an indication of a successful run-in test completion at the end of the test cycle if the UUT successfully completes the execution of the self-diagnostic software during the test cycle.

6. The run-in test system of claim 1 wherein the UUT-executable communication/diagnostic branch control software stored in the memory further includes cycling temperature diagnostic phase software for generating high and low temperature control commands and causing the UUT to execute the self-diagnostic software during a cycling temperature diagnostic phase.

7. The run-in test system of claim 6 wherein the UUT-executable communication/diagnostic branch control software stored in the memory further includes software for causing the UUT to sequentially and repeatedly perform the relatively low temperature diagnostic phase, the relatively high temperature diagnostic phase and the cycling temperature diagnostic phase.

8. The run-in test system of claim 1 wherein:

the test system further includes a variable power supply for supplying power to the UUT; and the control system is coupled to the power supply and includes means for causing the power supply to vary the power supplied to the UUT during the relatively low and relatively high temperature diagnostic phases.

9. The run-in test system of claim 1 wherein the self-diagnostic software stored in the memory include OEM and aftermarket diagnostic software.

10. The run-in test system of claim 1 wherein the cooling system includes fans for forcing ambient air through the test chamber.

11. The run-in test system of claim 10 wherein the heating system includes a heater for heating the test chamber to a temperature greater than ambient temperature.

12. The run-in test system of claim 1 and further including stackable cabinets for enclosing the test chamber, heating system, cooling system, memory and control system.

13. The run-in test system of claim 12 wherein each cabinet further includes a drawer in which the test chamber, heating system, cooling system, memory and control system are mounted.

14. A run-in test system for microprocessor-based circuit boards, including:

a test chamber for removably receiving a microprocessor-based circuit board unit under test (UUT);

a heating system for heating a UUT in the test chamber;

a cooling system for cooling a UUT in the test chamber;

a display;

memory for storing software, including:

UUT-executable self-diagnostic software; and

UUT-executable communication/diagnostic branch control software for causing the UUT to sequentially and repeatedly perform low temperature diagnostic, high temperature diagnostic and cycling temperature diagnostic test phases, including:

low temperature diagnostic phase software for generating low temperature control commands and causing a UUT to execute the self-diagnostic software at a relatively low temperature during a relatively low temperature diagnostic phase;

high temperature diagnostic phase software for generating high temperature control commands and causing a UUT to execute the self-diagnostic software at a relatively high temperature during a relatively high temperature diagnostic phase; and cycling temperature diagnostic phase software for generating low temperature control commands and high temperature control commands and causing the UUT to execute the self-diagnostic software at both the relatively low temperature and the relatively high temperature during a cycling temperature diagnostic phase;

a variable power supply adapted for interconnection to the UUT; and a control system adapted for interconnection to the UUT and coupled to the power supply, heating system, cooling system and display, including:

run-in test initiating means for causing the UUT to initiate the execution of the self-diagnostic software and the communication/diagnostic branch control software;

cooling system control means for causing the cooling system to cool the UUTs to a first temperature in response to the low temperature control commands;

heating system control means for causing the heating system to heat the UUTs to a second temperature greater than the first temperature in response to the high temperature control commands;

power supply varying means for causing the power supply to vary the power supplied to the UUT during the diagnostic phases;

diagnostic software monitoring means for monitoring the UUT execution of the self-diagnostic software during the diagnostic phases; and display control means for causing the display to provide an indication of a run-in test failure if the UUT fails to successfully complete the execution of the self-diagnostic software during the diagnostic phases.

15. The run-in test system of claim 14 wherein:

the diagnostic software monitoring means of the control system includes a watchdog timer for timing watchdog periods during each relatively low, relatively high and cycling temperature diagnostic phase; and the display control means of the control system includes means for causing the display to provide an indication of a run-in test failure if the UUT fails to complete the execution of the self-diagnostic software during the watchdog periods.

16. The run-in test system of claim 15 wherein:

the control means further includes test cycle timing means for timing test cycles; and the display control means causes the display to provide an indication of a successful run-in test completion at the end of the test cycle if the UUT successfully completes execution of the self-diagnostic software diagnostics during the test cycle.

17. The run-in test system of claim 14 wherein the cooling system includes fans for forcing ambient air through the test chamber.

18. The run-in test system of claim 17 wherein the heating system includes a heater for heating the test chamber to a temperature greater than ambient temperature.

19. The run-in test system of claim 18 and further including stackable cabinets for enclosing the test chamber, power supply, heating system, cooling system, memory and control system.

20. The run-in test system of claim 19 wherein each cabinet further includes a drawer in which the test chamber, power supply, heating system, cooling system, memory and control system are mounted.

21. A computer-readable storage medium programmed with communication/diagnostic branch control software for execution by a microprocessor-based circuit board unit under test (UUT), and adapted for use in connection with a run-in test system of the type including a temperature control system, a display, memory for storing UUT-executable self-diagnostic software and diagnostic software monitoring means for monitoring the UUT execution of the self-diagnostic software and causing the display to provide an indication of a run-in test failure if the UUT fails to properly execute the self-diagnostic software, wherein the communication/diagnostic branch control software includes:

cold mode software means for causing the UUT to operate in a cold mode diagnostic phase, including means for causing the temperature control system to cool the UUT to a first temperature, means for causing the UUT to execute the self-diagnostic software, and means for activating the diagnostic software monitoring means; and hot mode software means for causing the UUT to operate in a hot mode diagnostic phase, including means for causing the temperature control system to heat the UUT to a second temperature which is greater than the first temperature, means for causing the UUT to execute the self-diagnostic software, and means for activating the diagnostic software monitoring means.

22. The computer-readable storage medium of claim 21 wherein the communication/diagnostic branch control software further includes:

cycling mode software means for causing the UUT to operate in a cycling mode diagnostic phase, including means for causing the temperature control system to vary the temperature of the UUT between the first and second temperatures, means for causing the UUT to execute the self-diagnostic software, and means for activating the diagnostic software monitoring means.

23. The computer-readable storage medium of claim 22 wherein the run-in test system further includes test cycle timing means for timing test cycles and for causing the display to provide an indication of a successful run-in test if the UUT successfully executes the self-diagnostic software during the test cycle, and the communication/diagnostic branch control software further includes:

test cycle mode means for causing the UUT to sequentially and repeatedly operate in the cold mode diagnostic phase and the hot mode diagnostic phase.

24. The computer-readable storage medium of claim 22 wherein the run-in test system diagnostic software monitoring means includes a watchdog timer for timing watchdog periods during the diagnostic phases, and wherein:

the hot mode software and cold mode software means for activating the diagnostic software monitoring means includes means for activating the watchdog timer.

25. A computer-readable storage medium programmed with communication/diagnostic branch control software for execution by a microprocessor-based circuit board unit under test (UUT), and adapted for use in connection with a microprocessor-based circuit board run-in test system of the type including a temperature control system, a display, memory for storing UUT-executable self-diagnostic software, watchdog timer means for timing watchdog periods and for causing the display to provide an indication of a run-in test failure if the UUT fails to properly execute the self-diagnostic software during the watchdog periods, and test cycle timing means for timing a test cycle and for causing the display to provide an indication of a successful run-in test if the UUT successfully executes the self-diagnostic software during the test cycle, wherein the communication/diagnostic branch control software includes:

cold mode software means for causing the UUT to operate in a cold mode diagnostic phase, including means for causing the temperature control system to cool the UUT to a first temperature, means for causing the UUT to execute the self-diagnostic software, and means for activating the watchdog timer means;

hot mode software means for causing the UUT to operate in a hot mode diagnostic phase, including means for causing the temperature control system to heat the UUT to a second temperature which is greater than the first temperature, means for causing the UUT to execute the self-diagnostic software, and means for activating the watchdog timer means;

cycling mode software means for causing the UUT to operate in a cycling mode diagnostic phase, including means for causing the temperature control system to vary the temperature of the UUT between the first and second temperatures, means for causing the UUT to execute the self-diagnostic software, and means for activating the watchdog timer means; and test cycle mode means for causing the UUT to sequentially and repeatedly operate in the cold mode diagnostic phase, the hot mode diagnostic phase and the cycling mode diagnostic phase.

\* \* \* \* \*